United States Patent
Hirasawa et al.

(10) Patent No.: US 10,297,937 B2
(45) Date of Patent: May 21, 2019

(54) COMPOSITE FLEXIBLE PRINTED WIRING BOARD AND METHOD FOR MANUFACTURING COMPOSITE FLEXIBLE PRINTED WIRING BOARD

(71) Applicant: IBIDEN CO., LTD., Ogaki (JP)

(72) Inventors: Takahisa Hirasawa, Ogaki (JP); Takayuki Furuno, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 0 days.

(21) Appl. No.: 16/049,861

(22) Filed: Jul. 31, 2018

(65) Prior Publication Data

US 2019/0036247 A1    Jan. 31, 2019

(30) Foreign Application Priority Data

Jul. 31, 2017    (JP) ................. 2017-148212

(51) Int. Cl.
| | |
|---|---|
| *H01R 12/61* | (2011.01) |
| *H05K 1/14* | (2006.01) |
| *H01R 4/62* | (2006.01) |
| *H01R 43/02* | (2006.01) |
| *H05K 3/00* | (2006.01) |
| *H05K 3/36* | (2006.01) |
| *H01R 43/20* | (2006.01) |

(52) U.S. Cl.
CPC .......... *H01R 12/613* (2013.01); *H01R 4/625* (2013.01); *H01R 43/0214* (2013.01); *H01R 43/0221* (2013.01); *H01R 43/205* (2013.01); *H05K 1/147* (2013.01); *H05K 3/005* (2013.01); *H05K 3/361* (2013.01); *H05K 2201/058* (2013.01); *H05K 2201/10295* (2013.01); *H05K 2203/072* (2013.01); *H05K 2203/0723* (2013.01)

(58) Field of Classification Search
USPC ........................................ 361/751, 749, 739
See application file for complete search history.

(56) References Cited

U.S. PATENT DOCUMENTS

| | | | | |
|---|---|---|---|---|
| 2005/0257952 A1* | 11/2005 | Morimoto | .............. | H05K 3/281 |
| | | | | 174/256 |
| 2017/0223816 A1* | 8/2017 | Hirasawa | .............. | H05K 3/328 |

FOREIGN PATENT DOCUMENTS

JP    2016-058509 A    4/2016

* cited by examiner

*Primary Examiner* — Andargie M Aychillhum
(74) *Attorney, Agent, or Firm* — Oblon, McClelland, Maier & Neustadt, L.L.P.

(57) ABSTRACT

A composite flexible printed wiring board includes a first flexible printed wiring board having an insulating layer, conductor layers and a first metal block fitted in a hole penetrating through the conductor layers and insulating layer, and a second flexible printed wiring board having an insulating layer, conductor layers and a second metal block fitted in a hole penetrating through the conductor layers and insulating layer. The first flexible printed wiring board and the second flexible printed wiring board have a welded portion formed by welding the first metal block and the second metal block and joining the first metal block and the second metal block such that the welded portion is joining the first flexible printed wiring board and the second flexible printed wiring board.

20 Claims, 4 Drawing Sheets

COMPOSITE FLEXIBLE PRINTED WIRING BOARD AND METHOD FOR MANUFACTURING COMPOSITE FLEXIBLE PRINTED WIRING BOARD

CROSS-REFERENCE TO RELATED APPLICATIONS

The present application is based upon and claims the benefit of priority to Japanese Patent Application No. 2017-148212, filed Jul. 31, 2017, the entire contents of which are incorporated herein by reference.

BACKGROUND OF THE INVENTION

Field of the Invention

The present invention relates to a composite flexible printed wiring board and a method for manufacturing the composite flexible printed wiring board.

Description of Background Art

Japanese Patent Laid-Open Publication No. 2016-58509 describes an example of a flexible printed wiring board having a top view shape that is not rectangular. The entire contents of this publication are incorporated herein by reference.

SUMMARY OF THE INVENTION

According to one aspect of the present invention, a composite flexible printed wiring board includes a first flexible printed wiring board having a first insulating layer, a first conductor layer formed on a first surface of the first insulating layer, a second conductor layer formed on a second surface on the opposite side with respect to the first surface, and a first metal block fitted in a hole penetrating through the first conductor layer, the first insulating layer and the second conductor layer, and a second flexible printed wiring board having a second insulating layer, a third conductor layer formed on a first surface of the second insulating layer, a fourth conductor layer formed on a second surface of the second insulating layer on the opposite side with respect to the first surface of the second insulating layer, and a second metal block fitted in a hole penetrating through the third conductor layer, the second insulating layer, and the fourth conductor layer. The first flexible printed wiring board and the second flexible printed wiring board have a welded portion formed by welding the first metal block and the second metal block and joining the first metal block and the second metal block such that the welded portion is joining the first flexible printed wiring board and the second flexible printed wiring board.

According to another aspect of the present invention, a method for manufacturing a composite flexible printed wiring board includes preparing a first flexible printed wiring board having a first insulating layer, a first conductor layer formed on a first surface of the first insulating layer, a second conductor layer formed on a second surface on the opposite side with respect to the first surface, and a first metal block fitted in a hole penetrating through the first conductor layer, the first insulating layer and the second conductor layer, preparing a second flexible printed wiring board having a second insulating layer, a third conductor layer formed on a first surface of the second insulating layer, a fourth conductor layer formed on a second surface of the second insulating layer on the opposite side with respect to the first surface of the second insulating layer, and a second metal block fitted in a hole penetrating through the third conductor layer, the second insulating layer, and the fourth conductor layer, placing the first flexible printed wiring board and the second flexible printed wiring board such that the first metal block is aligned with the second metal block for welding, and welding the first metal block and the second metal block such that the first flexible printed wiring board and the second flexible printed wiring board have a welded portion joining the first metal block and the second metal block and that the welded portion joins the first flexible printed wiring board and the second flexible printed wiring board.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 5A-5F are process diagrams schematically illustrating an example of a method for manufacturing a flexible printed wiring board;

DETAILED DESCRIPTION OF THE EMBODIMENTS

Embodiments will now be described with reference to the accompanying drawings, wherein like reference numerals designate corresponding or identical elements throughout the various drawings.

Figures 1A, 1B:
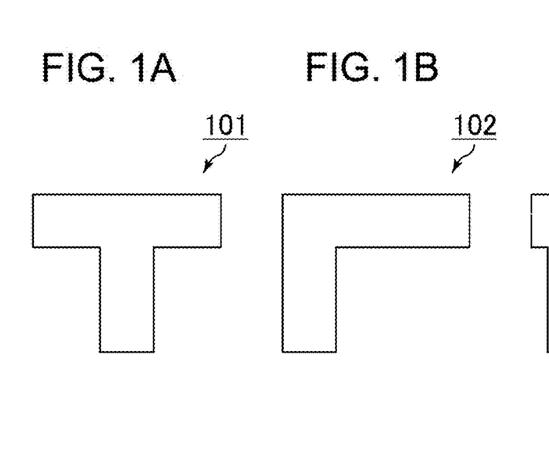
FIGS. 1A, 1B and 1C are top views schematically illustrating examples of irregularly shaped flexible printed wiring boards.
Figure 1C:
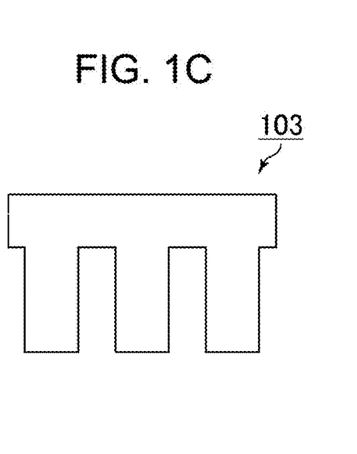

FIGS. 1A, 1B and 1C are top views schematically illustrating examples of irregularly shaped flexible printed wiring boards.

Figure 2:
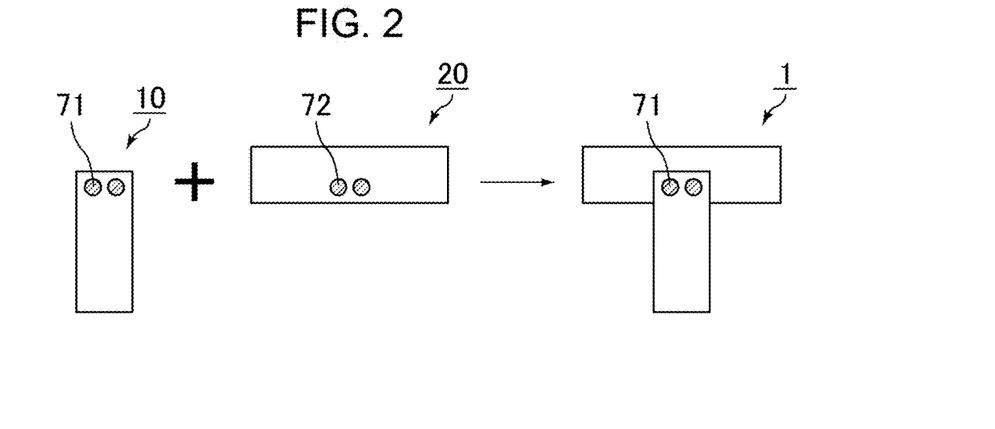
FIG. 2 is a top view schematically illustrating an irregularly shaped composite flexible printed wiring board according to an embodiment of the present invention and a method for obtaining the irregularly shaped composite flexible printed wiring board.

FIG. 2 is a top view schematically illustrating an irregularly shaped composite flexible printed wiring board according to an embodiment of the present invention and a method for obtaining the irregularly shaped composite flexible printed wiring board.

Figure 3A:
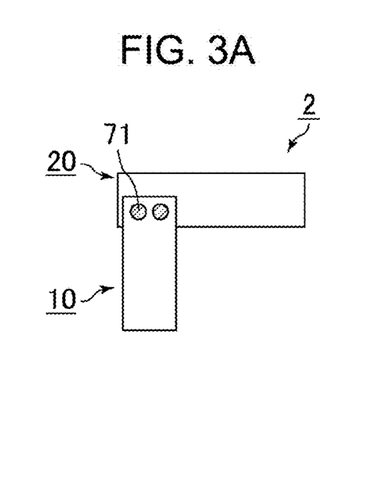
FIGS. 3A and 3B are top views schematically illustrating irregularly shaped composite flexible printed wiring boards according to other embodiments of the present invention.
Figure 3B:
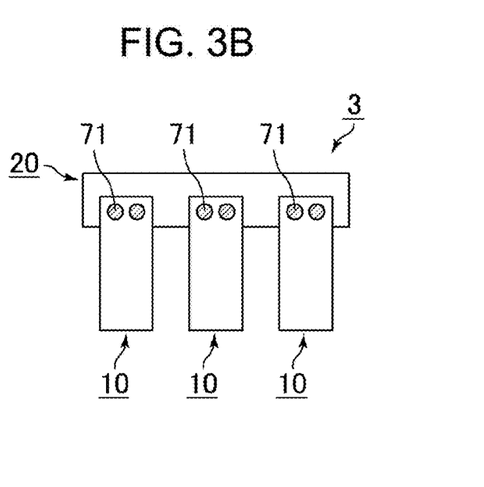

FIGS. 3A and 3B are top views schematically illustrating irregularly shaped composite flexible printed wiring boards according to other embodiments of the present invention.

FIGS. 1A, 1B and 1C respectively illustrate a T-shaped flexible printed wiring board 101, an L-shaped flexible printed wiring board 102, and a strip-shaped flexible printed wiring board 103 as examples of irregularly shaped flexible printed wiring boards.

FIG. 2 illustrates a state in which a first flexible printed wiring board 10 is placed on a second flexible printed wiring board 20 to obtain a T-shaped composite flexible printed wiring board 1.

Since the first flexible printed wiring board 10 and the second flexible printed wiring board 20 are both rectangular in shape, the first flexible printed wiring board 10 and the second flexible printed wiring board 20 both have a shape that does not cause waste in the number of parts produced during fabrication.

The T-shaped composite flexible printed wiring board 1 is obtained by providing a first metal block 71 in the first flexible printed wiring board 10, and providing a second metal block 72 in the second flexible printed wiring board 20, and joining the first metal block 71 and the second metal block 72 by welding.

FIG. 3A illustrates an L-shaped composite flexible printed wiring board 2. The L-shaped composite flexible printed wiring board 2 is obtained by providing a second metal block 72 at an end (left end) of the second flexible printed wiring board 20, and placing the first metal block 71 of the first flexible printed wiring board 10 on the second metal block 72 and joining the first metal block 71 and the second metal block 72 by welding.

FIG. 3B illustrates a strip-shaped composite flexible printed wiring board 3. The strip-shaped composite flexible printed wiring board 3 is obtained by respectively providing second metal blocks 72 at a left end, a center and a right end of the second flexible printed wiring board 20, and using three first flexible printed wiring boards 10 and respectively placing the first metal blocks 71 of the three first flexible printed wiring boards 10 on the second metal blocks 72 and respectively joining the first metal blocks 71 to the second metal blocks 72 by welding.

As illustrated in FIG. 3B, in a composite flexible printed wiring board according to an embodiment of the present invention, it is also possible to use multiple first flexible printed wiring boards. Further, it is also possible to use multiple second flexible printed wiring boards, or multiple first flexible printed wiring boards and multiple second flexible printed wiring boards.

Figure 4:
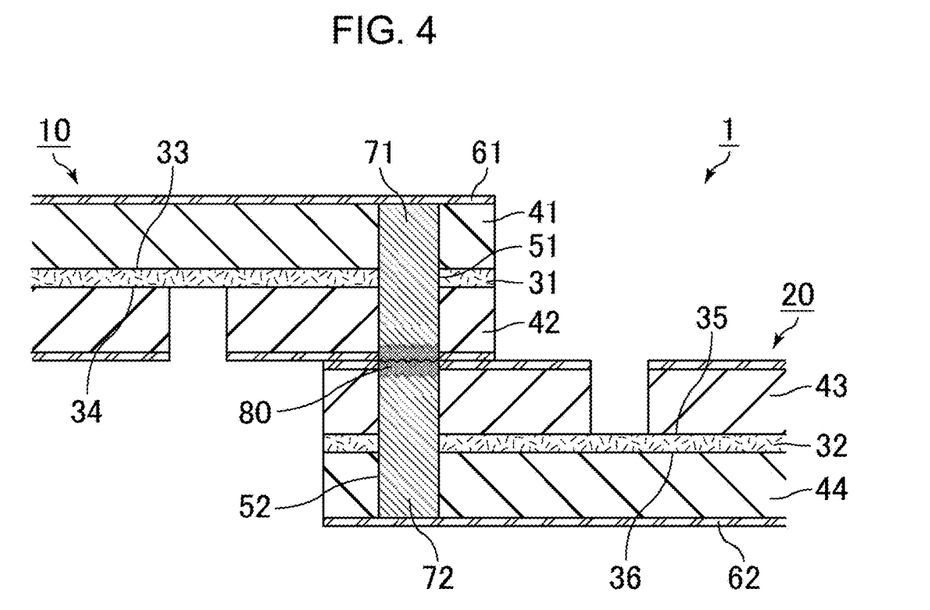
FIG. 4 is a cross-sectional view schematically illustrating an example of a portion where a first metal block and a second metal block are joined by welding in a composite flexible printed wiring board according to an embodiment of the present invention.

FIG. 4 is a cross-sectional view schematically illustrating an example of a portion where a first metal block and a second metal block are joined by welding in a composite flexible printed wiring board according to an embodiment of the present invention.

The composite flexible printed wiring board 1 of an embodiment of the present invention illustrated in FIG. 4 is obtained by joining a first flexible printed wiring board 10 and a second flexible printed wiring board 20.

The first flexible printed wiring board 10 includes a first insulating layer 31, a first conductor layer 41 formed on a main surface 33 on one side of the first insulating layer 31, and a second conductor layer 42 formed on a main surface 34 on the other side of the first insulating layer 31. The first flexible printed wiring board 10 includes a hole 51 penetrating the first conductor layer 41, the first insulating layer 31 and the second conductor layer 42, and a first metal block 71 fitted in the hole 51.

Further, a plating layer 61 is provided on an outermost layer of the first flexible printed wiring board 10. The plating layer 61 is formed on a surface of the first conductor layer 41 and on a surface of the first metal block 71 on the first conductor layer 41 side, and is further formed on a surface of the second conductor layer 42 and on a surface of the first metal block 71 on the second conductor layer 42 side.

Providing the plating layer 61 prevents the first metal block 71 from coming out from the first flexible printed wiring board 10, and thus is preferable.

The second flexible printed wiring board 20 includes a second insulating layer 32, a third conductor layer 43 formed on a main surface 35 on one side of the second insulating layer 32, and a fourth conductor layer 44 formed on a main surface 36 on the other side of the second insulating layer 32. The second flexible printed wiring board 20 includes a hole 52 penetrating the third conductor layer 43, the second insulating layer 32 and the fourth conductor layer 44, and a second metal block 72 fitted in the hole 52.

Further, a plating layer 62 is provided on an outermost layer of the second flexible printed wiring board 20. The plating layer 62 is formed on a surface of the third conductor layer 43 and on a surface of the second metal block 72 on the third conductor layer 43 side, and is further formed on a surface of the fourth conductor layer 44 and on a surface of the second metal block 72 on the fourth conductor layer 44 side.

Providing the plating layer 62 prevents the second metal block 72 from coming out from the second flexible printed wiring board 20, and thus is preferable.

In this way, flexible printed wiring boards having the same structure can be used as the first flexible printed wiring board 10 and the second flexible printed wiring board 20.

The first metal block 71 and the second metal block 72 are joined by welding. FIG. 4 illustrates a welded portion 80 which is a portion where the first metal block 71 and the second metal block 72, including also the plating layer 61 and the plating layer 62, are joined by welding. In other words, the first metal block 71 and the second metal block 72 are joined via the welded portion 80.

In the following, the elements that form a composite flexible printed wiring board according to an embodiment of the present invention are described in detail.

The first insulating layer and the second insulating layer (hereinafter, which may also be collectively simply referred to as insulating layers) are preferably formed of an insulating resin. Examples of a material that forms the insulating resin include polyimide, glass epoxy and the like. Among these materials, polyimide is preferable. When the insulating resin is polyimide, the insulating resin is both flexible and insulating. Therefore, a shape can be deformed according to an intended use, while sufficient insulation is ensured.

Thicknesses of the first insulating layer and the second insulating layer are not particularly limited, but are preferably each 30-70 μm. When the thicknesses of the first insulating layer and the second insulating layer are each smaller than 30 μm, the first insulating layer and the second insulating layer easily bend, and further, since a substrate that easily bends is formed, bonding with a wiring or another member may be easily broken. On the other hand, when the thicknesses of the first insulating layer and the second insulating layer are each larger than 70 μm, when a hole is formed by punching in order to provide a metal block, a crack is likely to occur around the hole and reliability may decrease.

A material that forms the first conductor layer, the second conductor layer, the third conductor layer and the fourth conductor layer (hereinafter, which may be collectively simply referred to as conductor layers) is not particularly limited, but is preferably copper, nickel or the like.

These materials have good electrical conductivity and can be suitably used as conductors.

Thicknesses of the first conductor layer, the second conductor layer, the third conductor layer and the fourth conductor layer are not particularly limited, but are preferably larger than the thicknesses of the first insulating layer and the second insulating layer. Further, the thicknesses of the first conductor layer, the second conductor layer, the third conductor layer and the fourth conductor layer are preferably each 10-300 μm. When the thicknesses of the first conductor layer, the second conductor layer, the third conductor layer and the fourth conductor layer are each smaller than 10 μm, during handling, the conductor layers may be easily broken and a failure rate may increase. On the other hand, when the thicknesses of the first conductor layer, the second conductor layer, the third conductor layer and the fourth conductor layer are each greater than 300 μm, when a flexible printed wiring board is bent and used, due to the bending, a compressive stress applied from the conductor layers to the insulating layers is large and thus the insulating layers may be easily broken.

The first metal block and the second metal block are respectively fitted in the holes that penetrate the insulating layers and the conductor layers.

A material of the first metal block and the second metal block is not particularly limited, but is preferably copper that is excellent in electrical conductivity and thermal conductivity.

The metal blocks are suitable for flowing a large current, and are suitable as a base material for performing welding as compared to a case of a structure such as a through hole, or a bottomed filled via that is considered as a conductive structure positioned in a thickness direction.

Further, different from filled vias that are each formed in a through hole through a chemical process such as plating, the metal blocks do not have voids formed therein and do not have concave or convex portions or the like on surfaces thereof. Since there are no voids formed inside the metal blocks, heat-transfer efficiency of the metal blocks is not reduced, and heat dissipation performance can be ensured. Further, the metal blocks are also preferable in that conductor volumes of the metal blocks can be easily increased as compared to filled vias.

Further, shapes of the metal blocks are not particularly limited, but are preferably each a columnar shape having a flat bottom surface (front surface). Examples of such shapes include shapes of a circular column, a quadrangular column, a hexagonal column, an octagonal column, and the like.

Cross-sectional areas of the first metal block and the second metal block are preferably each 0.05-3.2 $mm^2$. The cross-sectional areas of the first metal block and the second metal block are areas of the surfaces of the first metal block and the second metal block when the composite flexible printed wiring board is viewed from above.

When the cross-sectional areas of the first metal block and the second metal block are each 0.05 $mm^2$ or more, resistance of each of the first metal block and the second metal block itself is sufficiently small, and thus the first metal block and the second metal block can be prevented from being melted and damaged by a current that is caused to flow for resistance welding. On the other hand, it is normally not necessary for the first metal block and the second metal block to have large dimensions such that the cross-sectional areas of the first metal block and the second metal block each exceed 3.2 $mm^2$.

The first metal block and the second metal block may be joined by laser welding or by resistance welding.

A form of a welded portion formed by resistance welding and a form of a welded portion formed by laser welding are different from each other. Therefore, it is possible to distinguish whether the welding of the first metal block and the second metal block is performed by laser welding or by resistance welding.

When the welding is performed by laser welding, of a boundary surface between the first metal block and the second metal block, only a portion corresponding to a diameter of a laser beam is a welded portion.

When the welding is performed by resistance welding, the entire boundary surface between the first metal block and the second metal block is a welded portion.

In order to join the first metal block and the second metal block by laser welding, the laser welding can be performed by taking the surface of the first metal block on the first conductor layer side (the surface on an opposite side with respect to the second metal block) as a surface to be irradiated with laser and placing the surface of the first metal block on the second conductor layer side on the second metal block, and irradiating laser toward the surface of the first metal block on the first conductor layer side.

When there is a plating layer on the surface of the first conductor block on the first conductor layer side, the surface of the plating layer may be regarded as the surface to be irradiated with a laser.

As laser used for laser welding, $CO_2$ laser, YAG laser, semiconductor laser, or the like can be used.

In order to join the first metal block and the second metal block by resistance welding, a welding tool of a resistance welding apparatus as an electrode is brought into contact with the surface of the first metal block on the first conductor layer side (the surface on an opposite side with respect to the second metal block), and the surface of the first metal block on the second conductor layer side is placed on the surface of the second metal block on the third conductor layer side, and a welding tool of the resistance welding apparatus is also brought into contact with the surface of the second metal block on the fourth conductor layer side (the surface on an opposite side with respect to the first metal block).

When a current is caused to flow between the two welding tools, heat is generated between the surface of the first metal block on the second conductor layer side and the surface of the second metal block on the third conductor layer side, and thus resistance welding can be performed.

When there is a plating layer on the surface of the first metal block on the first conductor layer side and there is a plating layer on the surface of the second metal block on the fourth conductor layer side, surfaces of the plating layers may be respectively regarded as surfaces to be in contact with the welding tools.

A plating layer is preferably provided on an outermost layer of each of the first flexible printed wiring board and the second flexible printed wiring board. As the plating layers, copper plating layers are preferably provided. By providing the plating layers so as to cover the metal blocks, the metal blocks are prevented from coming out from the holes of the flexible printed wiring boards.

A dissimilar metal layer of a material different from that of the first metal block and the second metal block is preferably formed on a to-be-welded end surface of at least one of the first metal block and the second metal block.

An example of a preferred combination of the materials of the first metal block and the second metal block and the dissimilar metal layer is a combination in which the first metal block and the second metal block are copper blocks, and the dissimilar metal layer is a nickel plating layer, or a nickel plating layer/a gold plating layer.

The dissimilar metal layer may be provided as a plating layer provided on the metal blocks, or may be a nickel plating layer or a nickel plating layer/a gold plating layer further provided on the plating layer (copper plating layer).

When the dissimilar metal layer is provided, an alloy can be formed during welding between the metal forming the metal blocks and the metal forming the dissimilar metal layer, and thus, joining strength of the welded portion becomes sufficiently strong.

An example of the alloy is a copper-nickel alloy obtained when the metal blocks and the plating layer are formed of copper and a nickel plating layer or a nickel plating layer/a gold plating layer is provided on the plating layer.

It is preferable to provide the dissimilar metal layer on an outermost surface of a portion that will become the welded portion in the first flexible printed wiring board and the second flexible printed wiring board prior to welding. In this case, the dissimilar metal layer may be provided on only one or both of the first flexible printed wiring board and the second flexible printed wiring board prior to welding.

In the following, a method for manufacturing a composite flexible printed wiring board according to an embodiment of the present invention is described.

First, a method for manufacturing a flexible printed wiring board that can be used as the first flexible printed wiring board or the second flexible printed wiring board is described.

Method for Manufacturing Flexible Printed Wiring Board

FIG. 5A-5F are process diagrams schematically illustrating an example of the method for manufacturing a flexible printed wiring board.

In the following, a case is described where the first flexible printed wiring board is manufactured. However, the same also applies to a case of the second flexible printed wiring board.

(1) Conductor Substrate Preparation Process

First, as a conductor substrate preparation process, a conductor substrate formed by forming conductor layers on an insulating layer is prepared. The insulating layer becomes the first insulating layer, and the conductor layers respectively become the first conductor layer and the second conductor layer.

Figure 5A:
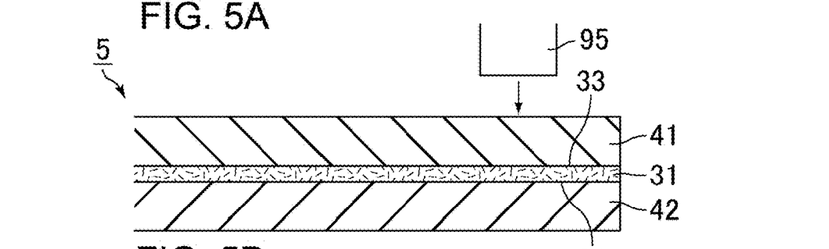

FIG. 5A illustrates a process of preparing a double-sided conductor substrate 5 in which the first conductor layer 41 is formed on the main surface 33 on one side of the first insulating layer 31 formed of an insulating resin, and the second conductor layer 42 is formed on the main surface 34 on the other side of the first insulating layer 31.

Materials of the first insulating layer 31, the first conductor layer 41 and the second conductor layer 42 are the same as those described in the description of the composite flexible printed wiring board and thus a description thereof is omitted.

(2) Hole Formation Process

Next, a hole 51 penetrating the first conductor layer 41, the first insulating layer 31 and the second conductor layer 42 is formed.

The hole is preferably formed by punching. FIG. 5A illustrates a state in which a punch 95 used in punching is arranged on the first conductor layer 41 side.

Figure 5B:
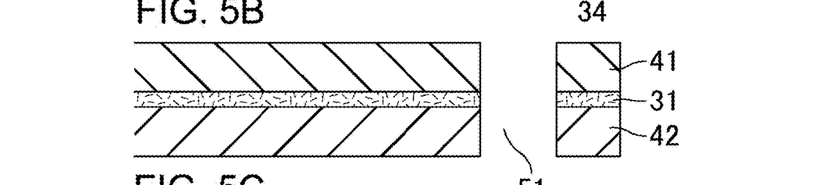

FIG. 5B illustrates the double-sided conductor substrate in which the hole 51 is formed.

(3) Metal Block Insertion Process

Next, by inserting a metal block into the hole, a metal block penetrating the first conductor layer, the first insulating layer and the second conductor layer is formed. The insertion of the metal block is preferably performed from an opposite side with respect to the side where the punching is performed.

Figure 5C:
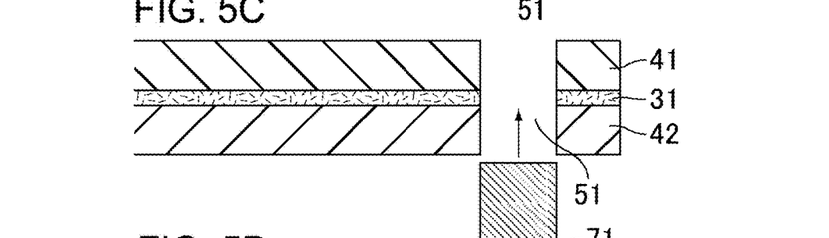

FIG. 5C illustrates an example in which the first metal block 71 is inserted into the hole 51 from the second conductor layer 42 side.

Further, when necessary, it is also preferable to perform other processes such as a coining process, a pressing process, and the like in order to improve flatness of the surface of the metal block.

Figure 5D:
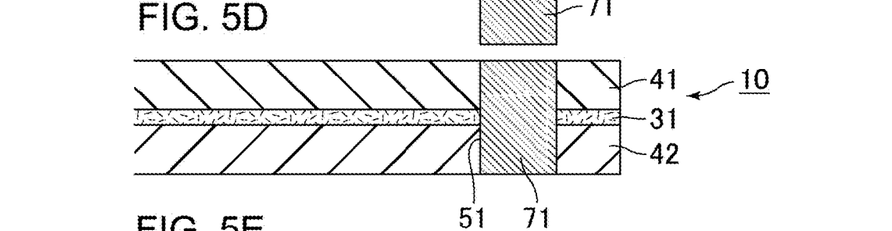

By the above-described processes, the first flexible printed wiring board 10 as illustrated in FIG. 5D can be manufactured.

(4) Plating Process

Figures 5E, 5F:
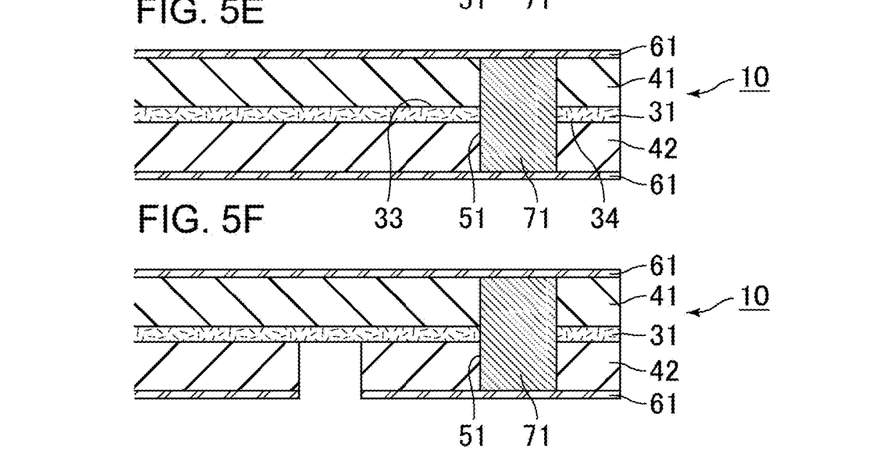

As illustrated in FIG. 5E, metal plating is performed, and the plating layer 61 is provided on the outermost layer of the first flexible printed wiring board 10. The plating layer 61 is formed on the surface of the first conductor layer 41 and on the surface of the first metal block 71 on the first conductor layer 41 side, and is further formed on the surface of the second conductor layer 42 and the surface of the first metal block 71 on the second conductor layer 42 side. Thereby, the first metal block 71 can be prevented from coming out from the first flexible printed wiring board 10.

As a plating method, a common method may be used, and a method in which electroless copper plating is performed and thereafter electrolytic copper plating is performed, or the like, can be applied.

Further, a dissimilar metal layer may be further provided on the plating layer. As the dissimilar metal layer, it is possible to use the above-described layer, and it is possible to provide a dissimilar metal layer formed from a nickel plating layer or a nickel plating layer/a gold plating layer.

(5) Pattern Formation Process

Further, when necessary, it is preferable to perform pattern formation with respect to the conductor layers to form necessary wirings. FIG. 5F illustrates a state in which pattern formation has been performed with respect to the second conductor layer.

Method for Manufacturing Composite Flexible Printed Wiring Board

Next, a method for manufacturing a composite flexible printed wiring board using flexible printed wiring boards manufactured using the above-described manufacturing method is described.

Figure 6:
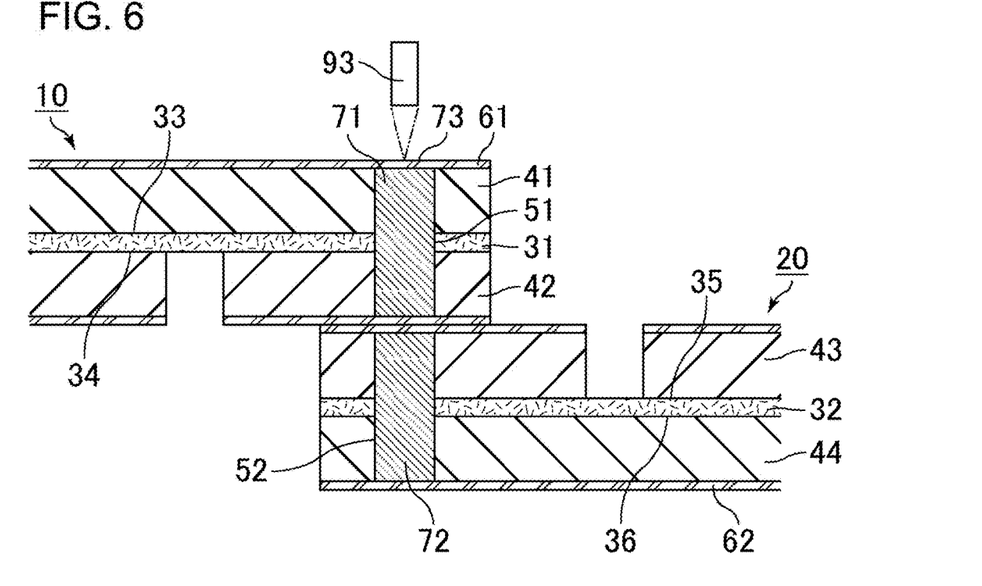
FIG. 6 is a process diagram schematically illustrating a process in which the first metal block and the second metal block are joined by laser welding.
Figure 7:
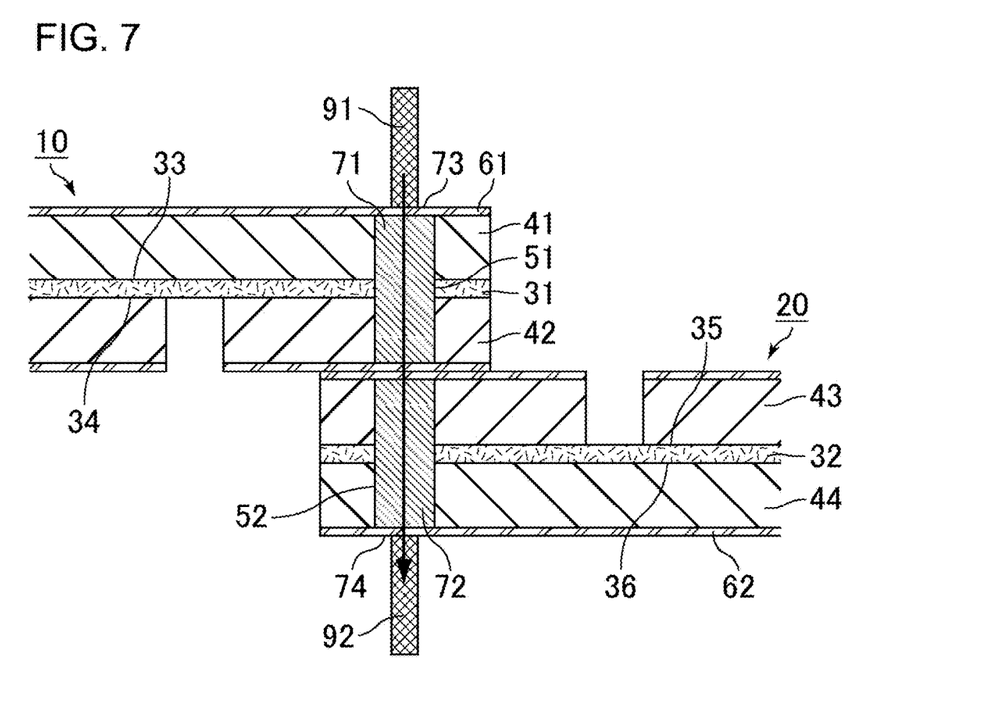
FIG. 7 is a process diagram schematically illustrating a process in which the first metal block and the second metal block are joined by resistance welding.

FIG. 6 is a process diagram schematically illustrating a process in which the first metal block and the second metal block are joined by laser welding. FIG. 7 is a process diagram schematically illustrating a process in which the first metal block and the second metal block are joined by resistance welding.

As flexible printed wiring boards, the first flexible printed wiring board 10 and the second flexible printed wiring board 20 are prepared.

The first flexible printed wiring board 10 and the second flexible printed wiring board 20 are placed on top of each other by aligning positions the first metal block 71 and the second metal block 72.

Next, the first metal block 71 and the second metal block 72 are joined by welding. However, the case of joining by laser welding and the case of joining by resistance welding are separately described.

In the case of laser welding, as illustrated in FIG. 6, the first metal block 71 and the second metal block 72 can be joined by laser welding by irradiating laser from a laser welding apparatus 93 toward a surface 73 of the first metal block 71 on an opposite side with respect to the second metal block 72.

In the case of resistance welding, as illustrated in FIG. 7, a welding tool 91 of a resistance welding apparatus is brought into contact with a surface 73 of the first metal block 71 on the first conductor layer 41 side (the surface 73 on an opposite side with respect to the second metal block 72), and a welding tool 92 of the resistance welding apparatus is brought into contact with a surface 74 of the second metal block 72 on the fourth conductor layer 44 side (the surface 74 on an opposite side with respect to the first metal block 71), and a current is caused to flow between the welding tools.

Then, heat is generated due to interface resistance between the first metal block 71 and the second metal block 72, and the metals forming the first metal block 71 and the second metal block 72 (also including the metals forming the plating layer 61 and the plating layer 62) melt due to the heat, and resistance welding is performed. As a result, the first metal block 71 and the second metal block 72 are directly joined by resistance welding.

FIG. 7 schematically illustrates a direction in which the current flows between the welding tools.

Through the above processes, the first metal block of the first flexible printed wiring board and the second metal block of the second flexible printed wiring board are joined by welding, and a composite flexible printed wiring board according to an embodiment of the present invention is manufactured.

When a flexible printed wiring board is manufactured by fabricating a block in which a shape as described in Japanese Patent Laid-Open Publication No. 2016-58509 is repeatedly drawn, a large portion of an area of a substrate may be wasted.

A composite flexible printed wiring board according to an embodiment of the present invention is obtained by joining a first flexible printed wiring board and a second flexible printed wiring board. The first flexible printed wiring board includes: a first insulating layer; a first conductor layer formed on a main surface on one side of the first insulating layer; a second conductor layer formed on a main surface on the other side of the first insulating layer; a hole penetrating the first conductor layer, the first insulating layer, and the second conductor layer; and a first metal block fitted in the hole. The second flexible printed wiring board includes: a second insulating layer; a third conductor layer formed on a main surface on one side of the second insulating layer; a fourth conductor layer formed on a main surface on the other side of the second insulating layer; a hole penetrating the third conductor layer, the second insulating layer, and the fourth conductor layer; and a second metal block fitted in the hole. The first metal block and the second metal block are joined by welding.

Further, a method for manufacturing a composite flexible printed wiring board according to an embodiment of the present invention includes: preparing a first flexible printed wiring board and a second flexible printed wiring board, the first flexible printed wiring board including: a first insulating layer; a first conductor layer formed on a main surface on one side of the first insulating layer; a second conductor layer formed on a main surface on the other side of the first insulating layer; a hole penetrating the first conductor layer, the first insulating layer, and the second conductor layer; and a first metal block fitted in the hole, and, the second flexible printed wiring board including: a second insulating layer; a third conductor layer formed on a main surface on one side of the second insulating layer, a fourth conductor layer formed on a main surface on the other side of the second insulating layer; a hole penetrating the third conductor layer, the second insulating layer, and the fourth conductor layer; and a second metal block fitted in the hole; placing the first flexible printed wiring board and the second flexible printed wiring board on top of each other by aligning positions the first metal block and the second metal block; and joining the first metal block and the second metal block by welding.

Obviously, numerous modifications and variations of the present invention are possible in light of the above teachings. It is therefore to be understood that within the scope of the appended claims, the invention may be practiced otherwise than as specifically described herein.

The invention claimed is:

1. A composite flexible printed wiring board, comprising:
a first flexible printed wiring board comprising a first insulating layer, a first conductor layer formed on a first surface of the first insulating layer, a second conductor layer formed on a second surface on an opposite side with respect to the first surface, and a first metal block fitted in a hole penetrating through the first conductor layer, the first insulating layer and the second conductor layer; and
a second flexible printed wiring board comprising a second insulating layer, a third conductor layer formed on a first surface of the second insulating layer, a fourth conductor layer formed on a second surface of the second insulating layer on an opposite side with respect to the first surface of the second insulating layer, and a second metal block fitted in a hole penetrating through the third conductor layer, the second insulating layer, and the fourth conductor layer,
wherein the first flexible printed wiring board and the second flexible printed wiring board have a welded portion formed by welding the first metal block and the second metal block and joining the first metal block and the second metal block such that the welded portion is joining the first flexible printed wiring board and the second flexible printed wiring board.

2. A composite flexible printed wiring board according to claim 1, wherein the first flexible printed wiring board and the second flexible printed wiring board have the welded portion formed by laser welding and joining the first metal block and the second metal block.

3. A composite flexible printed wiring board according to claim 2, wherein the first flexible printed wiring board and the second flexible printed wiring board have the welded portion formed by welding the first metal block and the second metal block with a dissimilar metal layer formed on an end surface of at least one of the first metal block and the second metal block such that the dissimilar metal layer is made of a metal material different from a metal material of the first metal block and the second metal block and forms the welded portion comprising an alloy of the metal material of the dissimilar metal layer and the metal material of the first metal block and the second metal block.

4. A composite flexible printed wiring board according to claim 3, wherein each of the first metal block and the second metal block is a copper block, and the metal material of the dissimilar metal layer is a nickel plating layer.

5. A composite flexible printed wiring board according to claim 1, wherein the first flexible printed wiring board and the second flexible printed wiring board have the welded portion formed by resistance welding and joining the first metal block and the second metal block.

6. A composite flexible printed wiring board according to claim 5, wherein the first flexible printed wiring board and the second flexible printed wiring board have the welded portion formed by welding the first metal block and the second metal block with a dissimilar metal layer formed on an end surface of at least one of the first metal block and the second metal block such that the dissimilar metal layer is made of a metal material different from a metal material of the first metal block and the second metal block and forms the welded portion comprising an alloy of the metal material of the dissimilar metal layer and the metal material of the first metal block and the second metal block.

7. A composite flexible printed wiring board according to claim 6, wherein each of the first metal block and the second metal block is a copper block, and the metal material of the dissimilar metal layer is a nickel plating layer.

8. A composite flexible printed wiring board according to claim 1, wherein the first flexible printed wiring board and the second flexible printed wiring board have the welded portion formed by welding the first metal block and the second metal block with a dissimilar metal layer formed on an end surface of at least one of the first metal block and the second metal block such that the dissimilar metal layer is made of a metal material different from a metal material of the first metal block and the second metal block and forms the welded portion comprising an alloy of the metal material of the dissimilar metal layer and the metal material of the first metal block and the second metal block.

9. A composite flexible printed wiring board according to claim 8, wherein each of the first metal block and the second metal block is a copper block, and the dissimilar metal layer is a nickel plating layer.

10. A composite flexible printed wiring board according to claim 1, wherein each of the first metal block and the second metal block has a columnar shape.

11. A composite flexible printed wiring board according to claim 1, wherein each of the first insulating layer and the second insulating layer comprises an insulating resin.

12. A composite flexible printed wiring board according to claim 1, wherein the first flexible printed wiring board comprises a first plating layer formed on the first conductor layer and a second plating layer formed on the second conductor layer, and the second flexible printed wiring board comprises a third plating layer formed on the third conductor layer and a fourth plating layer formed on the fourth conductor layer.

13. A composite flexible printed wiring board according to claim 1, wherein each of the first insulating layer and the second insulating layer has a thickness in a range of 30 μm to 70 μm.

14. A composite flexible printed wiring board according to claim 13, wherein each of the first conductor layer, the second conductor layer, the third conductor layer and the fourth conductor layer has a thickness in a range of 10 μm to 300 μm.

15. A composite flexible printed wiring board according to claim 1, wherein each of the first conductor layer, the second conductor layer, the third conductor layer and the fourth conductor layer has a thickness in a range of 10 μm to 300 μm.

16. A composite flexible printed wiring board according to claim 1, wherein each of the first metal block and the second metal block is a copper block, and the dissimilar metal layer comprises a nickel plating layer/a gold plating layer.

17. A composite flexible printed wiring board according to claim 1, wherein each of the first metal block and the second metal block has a cross-sectional area in a range of 0.05 $mm^2$ to 3.2 $mm^2$.

18. A method for manufacturing a composite flexible printed wiring board according to claim 1, wherein the welding the first metal block and the second metal block comprises bringing a welding tool of a resistance welding apparatus in contact with an end portion of the first metal block on an opposite side with respect to the second metal block and bringing another welding tool of the resistance welding apparatus in contact with an end portion of the second metal block on an opposite side with respect to the first metal block, and applying resistance welding to the first metal block and the second metal block.

19. A method for manufacturing a composite flexible printed wiring board, comprising:
    preparing a first flexible printed wiring board comprising a first insulating layer, a first conductor layer formed on a first surface of the first insulating layer, a second conductor layer formed on a second surface on an opposite side with respect to the first surface, and a first metal block fitted in a hole penetrating through the first conductor layer, the first insulating layer and the second conductor layer;
    preparing a second flexible printed wiring board comprising a second insulating layer, a third conductor layer formed on a first surface of the second insulating layer, a fourth conductor layer formed on a second surface of the second insulating layer on an opposite side with respect to the first surface of the second insulating layer, and a second metal block fitted in a hole penetrating through the third conductor layer, the second insulating layer, and the fourth conductor layer;
    placing the first flexible printed wiring board and the second flexible printed wiring board such that the first metal block is aligned with the second metal block for welding; and
    welding the first metal block and the second metal block such that the first flexible printed wiring board and the second flexible printed wiring board have a welded portion joining the first metal block and the second metal block and that the welded portion joins the first flexible printed wiring board and the second flexible printed wiring board.

20. A method for manufacturing a composite flexible printed wiring board according to claim 19, wherein the welding the first metal block and the second metal block comprises applying laser welding to an end portion of the first metal block on an opposite side with respect to the second metal block.

* * * * *